(12) United States Patent
Pelekanos et al.

(10) Patent No.: US 6,353,624 B1
(45) Date of Patent: Mar. 5, 2002

(54) SEMICONDUCTOR LASER WITH TUNABLE GAIN SPECTRUM

(75) Inventors: Nikolaos Pelekanos; Valentin Ortiz; Guido Mula, all of Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/397,106

(22) Filed: Sep. 16, 1999

(30) Foreign Application Priority Data

Oct. 7, 1998 (FR) .............................. 98 12558

(51) Int. Cl.[7] .............................. H01S 5/32; H01S 5/34
(52) U.S. Cl. .............................. 372/45; 372/46
(58) Field of Search .............................. 372/45, 43, 46, 372/50, 20, 102; 257/21; 385/131

(56) References Cited

U.S. PATENT DOCUMENTS 5,684,308 A * 11/1997 Lovejoy et al. ............. 257/184
5,698,863 A * 12/1997 Pelekanos ................... 357/71

FOREIGN PATENT DOCUMENTS

EP 0 681 200 11/1995

OTHER PUBLICATIONS

R. Andre, et al., "Optical Studies of the Piezoelectric Effect in (111)–Oriented CdTe/Cd$_{1-x}$Zn$_x$Te Strained Quantum Wells," *Physical Review*, vol. 42, No. 17, pp. 11392–11394.
E. Anastassakis, "Piezoelectric fields in Strained Heterostructures and Superlattices," *Physical Review B*, vol. 46, No. 8, Aug. 15, 1992, pp. 4744–4746.
N. K. Dutta, et al., "Tunable InGaAs/GaAs/InGaP Laser," *Applied Physics Letters*, vol. 70, No. 10, Mar. 10, 1997, p. 1219.
F. Favre, et al., "External–Cavity Semiconductor Laser with 15 nm Continuous Tuning Range," *Electronics Letters*, vol. 22, No. 15, Jul. 17, 1986, pp. 795–796.
F. Y. Huang. "Quantum–Confined Field–Effect Wavelength Tuning in a Three–Terminal Double Quantum Well Laser," *Applied Physics Letters*, vol. 56, No. 23, Jun. 4, 1990, pp. 2282–2284.
L. Y. Liu, et al., "Tunable Coupled–Quantum–Well Laser Controlled by an Electric Field," *Applied Physics Letters*, vol. 60, No. 24, Jun. 15, 1992, pp. 2971–2973.
S. Murata and I. Mito. "Frequency–Tunable Semiconductor Lasers," *Optical and Quantum Electronics*, vol. 22, 1990, pp. 1–15.
V. Ortiz, et al., "Efficient All–Optical Light Modulation in a Piezoelectric Heterostructure at Room Temperature," *Applied Physics Letters*, vol. 72, No. 8, Feb. 23, 1998, p. 963.

* cited by examiner

Primary Examiner—James W. Davie
Assistant Examiner—Cecil B. Harmon
(74) Attorney, Agent, or Firm—Burns Doane Swecker & Mathis LLP

(57) ABSTRACT

Semiconductor laser with a tunable gain spectrum. Said laser comprises an active zone having at least one active quantum well (AQW), which emits a laser radiation during the introduction of carriers into the active zone and at least one collection quantum well ($CQW_1$, $CQW_2$) on either side of the active well, for collecting and confining part of the carriers introduced. Means for distributing carriers in the collection wells are provided for creating a space charge field for modifying, during the emission of radiation and by an electrooptical effect, the gain spectrum of said active well. Application to optical telecommunications.

20 Claims, 3 Drawing Sheets

1

SEMICONDUCTOR LASER WITH TUNABLE GAIN SPECTRUM

DESCRIPTION

1. TECHNICAL FIELD

The present invention relates to a semiconductor laser with a tunable gain spectrum.

The invention is usable as a frequency-tunable laser source or as an optical gain switching device and has applications in various fields such as e.g. optical telecommunications, lidars and spectroscopy.

The word "laser" is used here in the broadest sense as a light amplifier with or without a cavity.

2. PRIOR ART

An article published in Appl. Phys. lett. 70 (10) on March 1997 written by N. K. Dutta, et al. discloses temperature variation-tunable laser diodes. Such diodes have a response time of approximately 1 second.

An article published in Electronic Letters, Jul. 17, 1986, Vol. 22, No. 15 by F. Favre, et al. discloses laser diodes tunable by means of an external diffraction grating. Such diodes have a response time of approximately 1 millisecond and are also ponderous and very costly.

An article published in Optical and Quantum Electronics 22 (1990) 1–15 by S. Murata, et al. discloses tunable laser diodes having an active region, a variable refractive index region and a region forming a distributed Bragg reflector, said regions being monolithically integrated on a substrate. Such diodes have a response time of approximately 1 nanosecond, but are difficult to manufacture and therefore expensive, whilst also requiring complex electronic means for controlling the wavelength of the laser radiation emitted, because three electric current are necessary for this purpose (namely one current for each of the aforementioned regions).

An article published in Applied Physics Letters 60 (24), Jun. 15, 1992 written by L. Y. Liu, et at. discloses the possibility of modulating the gain sspectrum during a laser emission by the quantum confined Stark effect. In the laser device described in this document, a quantum well active zone is formed in the intrinsic zone in a reverse biased P-I-N junction and the gain in the quantum well is obtained optically. Therefore such a laser device is not convenient.

DESCRIPTION OF THE INVENTION

The present invention aims at obviating the aforementioned disadvantages by proposing a wavelength-tunable laser diode with edge emission, which is easier to manufacture and therefore less expensive than the laser diodes known from the Murata article (it requires only a single control current), whilst being fast, its response time, i.e. its wavelength switching time, being approximately 1 nanosecond or less.

The tuning principle of this laser diode is based on a modulation by an electrooptical effect such as the quantum confined Stark effect of the gain spectrum of the diode during the emission of the laser radiation. The active zone of said laser diode is appropriately designed to ensure that the single injected current simultaneously produces a gain in the active layer and a space charge field permitting the modulation of the wavelength of the laser radiation.

In all the preferred embodiments of the invention, said wavelength is directly controlled by the current injected into the laser diode. However, in certain special embodiments, said wavelength can be controlled by an auxiliary laser beam.

In other special embodiments, the laser according to the invention can operate entirely optically. In this case, either the gain and the wavelength modulation are produced by a pumping laser beam, or the gain is produced by a pumping laser beam and the wavelength modulation by an auxiliary laser beam.

More generally, the invention proposes a tunable laser, whose wavelength can be very rapidly modified with a very short switching time of approximately 1 ns or less.

More specifically, the present invention relates to a tunable laser comprising a semiconductor heterostructure, said laser being characterized in that the heterostructure comprises an active zone having at least one quantum well called an active quantum well and which emits a laser radiation during the introduction of charge carriers into the active zone and at least one other quantum well called the collection quantum well, on either side of the active quantum well, the collection quantum wells being provided for collecting and confining part of the charge carriers introduced, and means for distributing charge carriers in the collection quantum wells so as to create a space charge field for acting on the active quantum well during the emission of the laser radiation by modifying, by an electrooptical effect, the gain spectrum of said active quantum well.

Thus, a variation in the number of charge carriers introduced is able to modify said space charge field and therefore the wavelength of the laser radiation.

Preferably, the lowest optical transition of each of the collection quantum wells is at an energy higher than that of the active quantum well.

Preferably, the fundamental states of the valence and conduction bands of the heterostructure are in the active quantum well.

According to a first special embodiment of the laser according to the invention, said laser forms a laser diode, the heterostructure forming a P-I-N junction which is to be forward biased and which has an intrinsic zone between a type P zone and a type N zone, the active zone being formed in said intrinsic zone, the laser radiation being emitted during the injection of a charge carrier flow into the active zone.

In this case, the charge carrier distribution means can comprise means for the forward biasing of the P-I-N junction, the inhomogeneity of the injection current in the active zone being responsible for the separation of the charge carriers.

According to a second special embodiment, the charge carrier distribution means comprise two piezoelectric barriers, which are respectively placed on either side of the active quantum well and which, by means of their piezoelectric fields, give rise to an accumulation of electrons and holes on either side of the active quantum well.

In said second embodiment, the active quantum well may not have a piezoelectric field or may have a piezoelectric field in the opposite direction to that created by the piezoelectric barriers or can have a piezoelectric field in the same direction as that created by the piezoelectric barriers.

Moreover, in said second embodiment, the collection quantum wells can be designed so that the times taken by the charge carriers for escaping said collection quantum wells are approximately 1 nanosecond.

According to a third special embodiment of the laser diode according to the invention, the active zone comprises at least two piezoelectric barriers and at least two collection quantum wells on either side of the active quantum well, the charge carrier distribution means comprising said piezoelectric barriers.

In this case, the forbidden band width of each of the collection quantum wells, which are respectively the most remote from the active quantum well, preferably exceeds those of each of the other collection quantum wells, so that the carriers can pass through by a tunnel effect.

In the case of the second and third embodiments, the number of charge carriers introduced can be kept constant, the wavelength of the laser radiation then being controlled by an auxiliary laser beam, whose photons have an energy greater than the forbidden band width of each piezoelectric barrier and whose intensity is sufficiently high to optically induce a charge of the heterostructure.

In this case, the charge carriers can be introduced by means of a laser beam for pumping the active zone. This laser beam for pumping the active zone can also constitute the auxiliary laser beam (also in order to control the wavelength).

As has been shown hereinbefore, in certain special embodiments of the invention, the separation of the charge carriers on either side of the active quantum well results from the introduction of piezoelectric layers into the active zone of the laser. For crystalline semiconductors of the zinc blende type, said piezoelectric layers are preferably stressed layers grown by epitaxy on the surface of the heterostructure substrate, the latter having high crystallographic indices (n, 1, m) with n×1×m≠0, such as e.g. a substrate (111) or (211).

In this connection reference can e.g. be made to a published article by E. Anastassakis in Physical Review B, Volume 46, Number 8, Aug. 15, 1992, which shows the biaxial stress present in such layers produces therein a strong piezoelectric field along the growth axis.

In such semiconductors of the zinc blende type, the piezoelectric fields can easily reach values exceeding 100 kV/cm for relatively moderate mixmatching stresses of the crystal lattices of approximately $\epsilon=0.7\%$ and in this connection reference can be made to a published article by R. Andre, et al. in Physical Review B, Volume 42, Number 17, Dec. 15, 1990.

The electrooptical effect used in the present invention is preferably the quantum confined Stark effect. However, other effects, such as e.g. the Franz-Keldysh or Wannier-Stark effect can also be used.

BRIEF DESCRIPTION OF THE DRAWINGS

The invention is described in greater detail hereinafter relative to non-limitative embodiments and with reference to the attached drawings, wherein show.

DETAILED DESCRIPTION OF SPECIAL EMBODIMENTS

A laser diode according to the invention is formed on a semiconductor layer (semiconductor substrate or buffer layer, e.g. of GaN, on an e.g. sapphire substrate) and comprises an active zone formed in the intrinsic zone I of a P-I-N junction, which is forward biased in order to make the laser diode operate.

On both sides of the active zone are provided one or more confinement layers for confining the laser radiation produced in the active zone and which can be doped (of type N when they are on the side of the N zone of the junction and type P when on the side of the P zone of said junction) in order to facilitate current injection into said junction.

Figure 1:
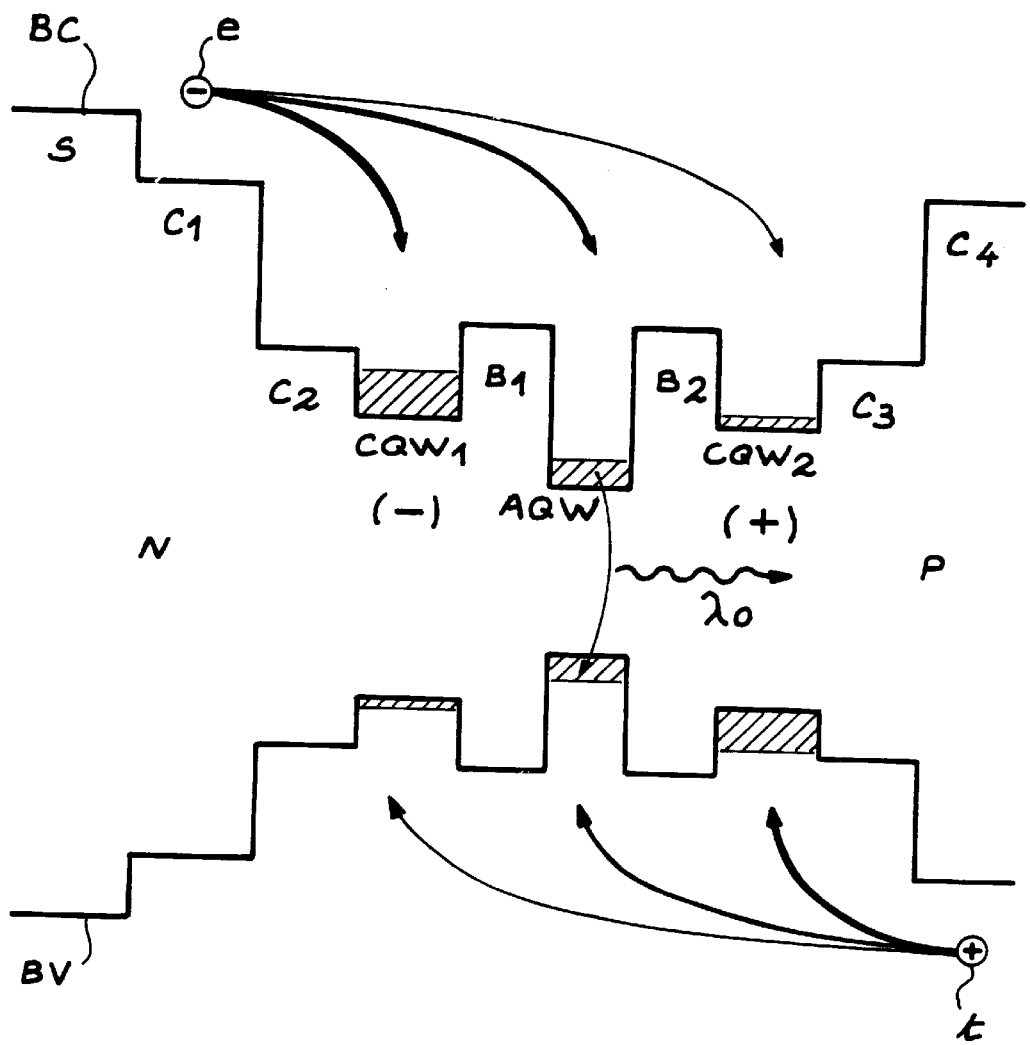
FIG. 1 Diagrammatically a first special embodiment of the laser according to the invention.

FIG. 1 diagrammatically illustrates an example of the active zone of a laser diode according to the invention in the form of a band diagram, the valence band being designated BV and the conduction band BC. Passing from left to right in FIG. 1 it is possible to successively see a first semiconductor layer S, which could be the substrate, a first, lower confinement layer $C_1$, a second, lower confinement layer $C_2$, a collection quantum well layer $CQW_1$, a barrier layer $B_1$, an active quantum well layer AQW, another barrier layer $B_2$, another collection quantum well layer $CQW_2$, a first, upper confinement layer $C_3$ and a second, upper confinement layer $C_4$. The conducting layers (electrodes) making it possible to forward bias the diode are not shown.

In a diode according to the invention, in the center of the active zone there is at least one active quantum well, which is the quantum well whose lowest optical transition is intended to emit a laser radiation and to be modulated. In the examples given, for reasons of clarity, a description is only given of heterostructure with a single active quantum well but, in other examples, said well could be replaced by two or more than two active quantum wells.

In the embodiment illustrated by FIG. 1, there is a collection quantum well on either side of the active quantum well, but it would also be possible to have two or more collection quantum wells on either side of the active quantum well.

Each collection quantum well is designed so that the lowest optical transition of said well is at an energy higher than that of the active quantum well, so as not to interfere with the laser emission of the active quantum well as a result of a needless absorption. The function of the collection quantum wells is to collect and confine charge carriers (electrons and holes), more simply referred to as carriers hereinafter and which are separated by a mechanism of which details will be given hereafter for the different embodiments. These separated carriers create a space charge field and therefore a wavelength modulation of the emitted laser radiation. Observations will now be made which apply to all the special embodiments of the invention and described hereinafter relative to the drawings.

On considering a heterostructure of the type of FIG. 1 for which the laser effect of the active quantum well occurs for a given current density $I_0$, said heterostructure is designed for the modulation, preferably by a quantum confined Stark effect, of the laser gain spectrum when the injected current density varies around $I_0$.

To do this, the heterostructure must firstly be able under the excitation conditions to accumulate in the collection quantum wells a sufficient charge density to produce a high space charge field. For example, in order to have a space charge field of 100 kV/cm, there is a need for a charge density of $6 \times 10^{11}$ cm$^{-2}$ in the collection quantum wells (ignoring the screening effects).

Simultaneously, the charge separation mechanism must be in an unsaturated state, i.e. a state where a variation of the density of the injected current causes a variation of the charge densities of the collection quantum wells and therefore a variation of the wavelength modulation.

Charge accumulation in the collection quantum wells is dependent on
(a) the charge separation mechanism and
(b) the escape times of the carriers collected in the collection quantum wells.

By solving simple equations describing the dynamics of the carriers in a structure according to FIG. 1 and using the charge separation mechanism described relative to the second preferred embodiment, it is possible to obtain the order of magnitude of the escape times necessary in order to have a high modulation effect for a given injected current density $I_0$.

For example, if $I_0$ is equal to 1 kA/cm$^2$, the times necessary for the carriers to escape from the collection quantum wells must be approximately 1 ns in order to obtain a space charge field of 50 kV/cm. If, in the example given, the escape times are well below 1 ns, calculations show that there is an insufficient charge accumulation in the collection quantum wells and that the modulation field is weak.

Moreover, if the escape times are much longer, there may be an excessive accumulation of charges and a high space charge field, which can be prejudicial to the laser effect of the active quantum well (i.e. an electric field displaces and reduces the gain spectrum and therefore too strong an electric field is prejudicial to the laser effect) or the state can be such that the charge separation process reaches saturation.

Thus, an appropriate "design" of the carrier escape times is essential for the satisfactory operation of the laser diode. Such a design is possible when considering that the main escape processes for carriers from the collection quantum wells are thermoionic emission over the barriers and the tunnel effect through said barriers.

By appropriately choosing the parameters of the heterostructure greatly influencing said processes, such as e.g. the heights and thicknesses of the barriers, it is possible to modify the escape levels of the carriers by several orders of magnitude.

In addition, the escape times for the carriers from the collection quantum wells at least partly control the laser diode wavelength switching rate. Assuming that said laser diode is controlled by a current density $I_0$ and that the charge density of the collection quantum wells corresponding thereto is $Q_0$.

A sudden increase of $I_0$ is followed by a rapid increase of $Q_0$ and the typical switch-up times necessary for establishing a new equilibrium are essentially the relaxation time of the hot carriers, which are a few dozen picoseconds. A sudden decrease in $I_0$ leads to a decrease of $Q_0$ but with longer switch down times, defined by the escape times of the carriers from the collection quantum wells.

As indicated hereinbefore, the desired escape times can easily be obtained through an appropriate design of the heterostructure and, for realistic designs, can be in an exemplified range of 100 ps to 1 ns, but could also be in a different range.

Moreover, in order that the active quantum well emits a laser radiation for reasonable current densities, it is necessary to ensure (a) that a large part of the injected carriers is collected in the active quantum well and (b) that the collected carriers remain in the active quantum well for sufficiently long time periods.

One way of fulfilling condition (a) is to ensure that the fundamental states of the valence band BV and conduction band BC of the heterostructure are both in the active quantum well.

To fulfill condition (b), the escape times for the carriers from the active quantum well must be longer than the stimulated emission or radiative recombination times.

Consideration will now be given to a first, preferred embodiment of the laser diode according to the invention.

This first embodiment is diagrammatically illustrated in FIG. 1 and has already been described. Its operating principle is explained hereinafter.

The active zone is in the P-I-N junction. Forward biasing means of said junction make it possible to inject into the active zone electrons e from zone N and holes t from zone P.

Due to the fact that the layer $CQW_1$ is close to zone N, the number of injected electrons collected by said layer $CQW_1$ exceeds the number collected by layer AQW and layer $CQW_2$. In addition, as said layer $CQW_2$ is close to zone P, the number of injected holes collected by said layer $CQW_2$ exceeds their number collected by the layer AQW and the layer $CQW_1$.

Thus, for injection current levels able to induce the laser effect in the layer AQW, there is a surplus of electrons in layer $CQW_1$ (which is symbolized by the sign (−) in FIG. 1) and a surplus of holes in layer $CQW_2$ (symbolized by the sign (+) in FIG. 1).

This leads to a space charge field modulating, preferably by means of the quantum confined Stark effect, the laser emission electronic transition of layer AQW.

As has been shown hereinbefore, the modulation consists of a displacement of the wavelength of the laser radiation and a gain variation.

If the injection current is further increased, the space charge field also increases and this also applies with regards to the modulation. This leads to the tuning of the wavelength $\lambda_0$ of the laser radiation of the laser diode.

This charge distribution or separation mechanism critically depends on the inhomogeneity of the injection current in the active zone. It is possible to influence the efficiency of charge separation by regulating as a consequence thereof the parameters of the heterostructure. For example, on increasing the distance between each collection quantum well and the active quantum well, the charge separation is more effective. Consideration will now be given to a second preferred embodiment of the laser diode according to the invention and which is diagrammatically illustrated by FIG. 2.

Figure 2:
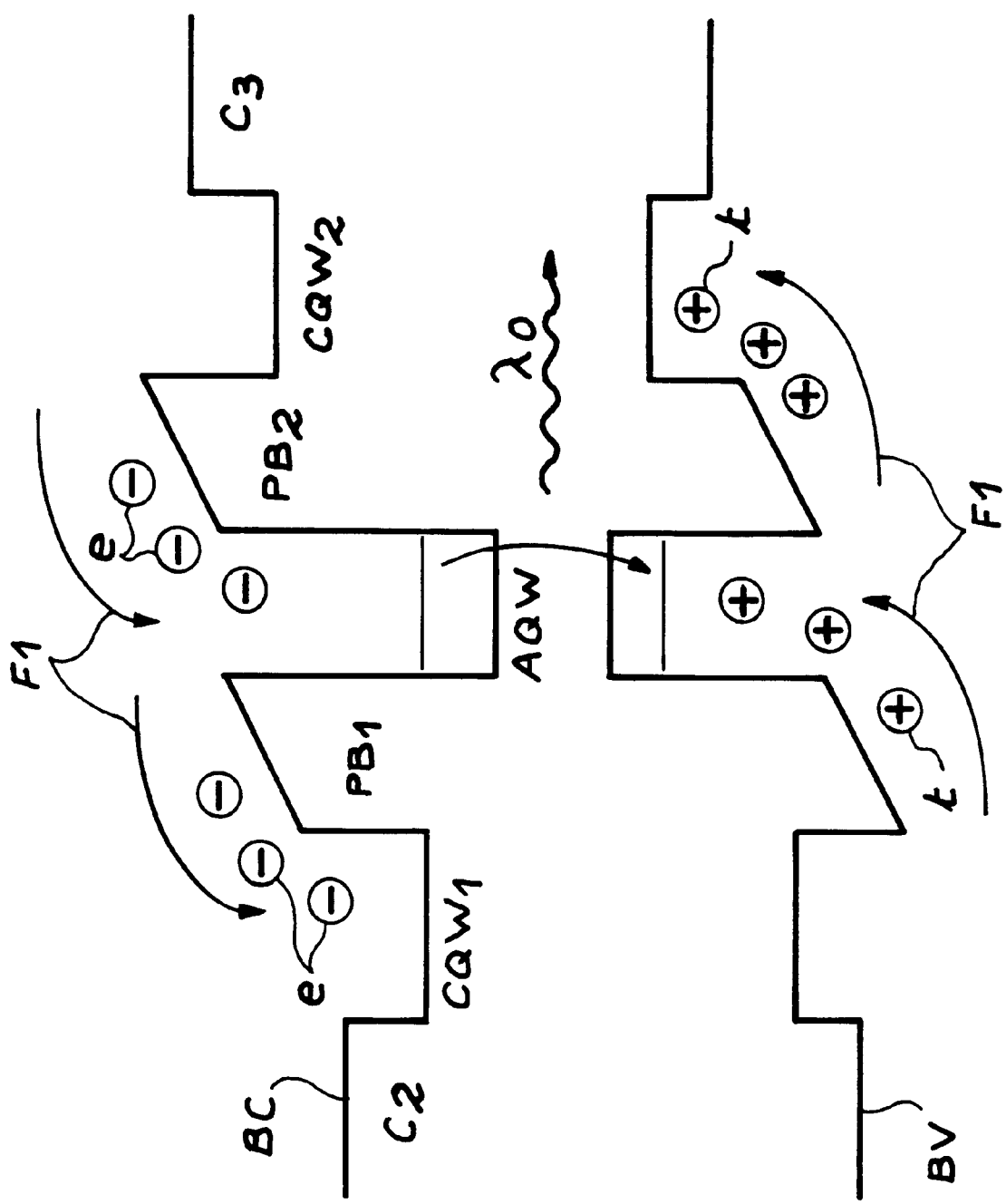
FIG. 2 Diagrammatically a second special embodiment, incorporating piezoelectric barriers.

The heterostructure of FIG. 2 is identical to that of FIG. 1, except that the barrier layers $B_1$ and $B_2$ of FIG. 1 are, in the case of FIG. 2, piezoelectric barrier layers $PB_1$ and $PB_2$. The semiconductor layer S, layer $C_1$ and layer $C_4$ are not shown in FIG. 2.

In this second preferred embodiment, the essential element for the charge distribution or separation process is constituted by the piezoelectric barriers positioned between the layer AQW and the layers $CQW_1$ and $CQW_2$.

For crystalline semiconductors of the zinc blende type, the heterostructure is made to grow on a semiconductor layer having high crystallographic indices (n, 1, m) with n×1×m≠0.

It is pointed out that the other layers of the active zone can also have a piezoelectric field.

This second embodiment is an improvement of the first in that the injection current inhomogeneity in the active zone is no longer a necessary condition for bringing about an appropriate charge separation. The charge separation mechanism in this second embodiment is explained hereinafter.

A fraction of the injected holes and electrons is separated on either side of each piezoelectric barrier layer by the action of the piezoelectric field. The electrons and holes collected in the layer AQW participate directly in the emission action of the laser radiation of said layer AQW and the result of the presence of the piezoelectric barrier layers is an accumulation of electrons in layer $CQW_1$ and holes in layer $CQW_2$.

The resulting space charge field then modulates the laser transition of layer AQW.

If the layer AQW has no piezoelectric field (case of FIG. 2) or a piezoelectric field in opposition to that of the piezoelectric barriers, then the space charge field leads to a shift towards higher wavelengths of the transition of layer AQW.

If the layer AQW has a piezoelectric field of the same direction as that of the piezoelectric barrier layers, then the space charge field brings about a shift towards short wavelengths of said laser transition.

It is possible to control the piezoelectric field of the layer AQW by simply regulating the stress state of said layer. Thus, as a function of the specific application needs, it is possible to conceive a laser diode tunable by the quantum confined Stark effect and whereof the emitted wavelength is shifted towards either high or low wavelengths.

The piezoelectric barrier heterostructure of FIG. 2 has points in common with the optically controlled light modulator described in Pelekanos (U.S. Pat. No. 5,698,863) (European Patent Application 0681200A1) and a published article by V. Ortiz, et al. in Appl. Phys. Lett. Volume 72, Number 8, Feb. 23, 1998. However, there are clear differences between the modulator and the diode as a result of their different functions.

In the modulator, the escape times of the collection quantum wells are approximately 1 $\mu$s in order to limit for practical reasons the power density of the optical control beam to a few watts per square centimeter. Consequently, the collection quantum wells are made relatively deep in order to reduce the escape levels by thermoionic emission and the piezoelectric barriers are made relatively thick to prevent them emptying rapidly by a tunnel effect through said barriers.

Moreover, in the present invention, the collection quantum well carrier escape times are approximately 1 ns in order to have a modulation effect for current densities of approximately 1 kA/cm$^2$, this being the density at which the laser effect most probably occurs. Therefore the collection quantum wells are made relatively less deep and the piezoelectric barriers relatively less thick.

Another design aspect crucial for the tunable laser diode and of no importance for the modulator is described hereinafter.

In order that the active quantum well emits a laser radiation for reasonable current densities, it is desirable that a considerable majority of the injected carriers is collected in the active quantum well and stays there for sufficiently long time periods to participate in the laser emission. One way of bringing this about is to ensure that the fundamental states of the valence and conduction bands of the heterostructure are in the active quantum well layer.

Figure 3:
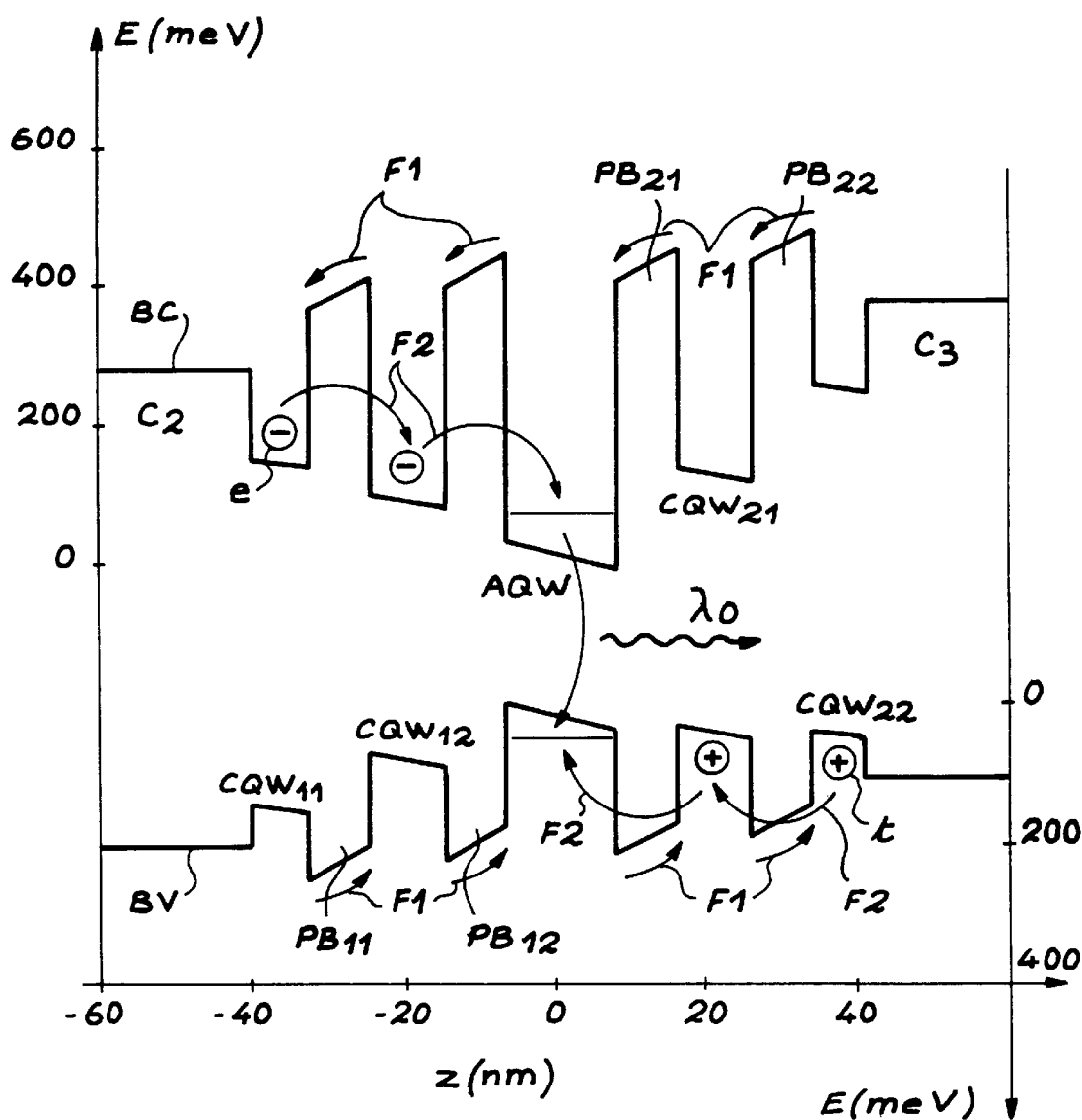
FIG. 3 Diagrammatically a third special embodiment, also incorporating piezoelectric barriers.

The third preferred embodiment of the invention diagrammatically illustrated in FIG. 3 is essentially an extension of the second embodiment and has the same operating principle.

The difference between the heterostructure of FIGS. 2 and 3 is due to the fact that that of FIG. 3 contains more than one piezoelectric barrier and more than one collection quantum well on either side of the active quantum well.

In the embodiment of FIG. 3 are successively provided from left to right the confinement layer $C_2$, a collection quantum well layer $CQW_{11}$, a piezoelectric barrier layer $PB_{11}$, another collection quantum well layer $CQW_{12}$, another piezoelectric barrier layer $PB_{12}$, the active quantum well layer AQW, a piezoelectric barrier layer $PB_{21}$, a collection quantum well layer $CQW_{21}$, another piezoelectric barrier layer $PB_{22}$ another collection quantum well layer $CQW_{22}$ and the confinement layer $C_3$. The substrate and the other confinement layers are not shown.

In a purely indicative and in no way limitative manner, FIG. 3 also provides numerical value examples for the thicknesses z of the different layers (in nanometres), taking the origin of the axis z in the center of the layer AQW and for energies E relative to the valence band and the conduction band of the heterostructure (in meV).

It is pointed out that the arrows F1 of FIG. 2 indicate the carrier separation process in the piezoelectric barriers and the situation is the same in FIG. 3. Arrows F2 in FIG. 3 indicate the transfer process by tunnel effect of the charge carriers from the collection wells to the active well.

The improvement resulting from the heterostructure of FIG. 3 compared with that of FIG. 2 is due to a reduction in the thickness of each piezoelectric barrier layer whilst retaining, for all the piezoelectric barrier layers, a sufficiently large overall thickness to have an effective charge separation. This leads to a significant increase in the probability of a tunnel effect of the carriers of the collection quantum wells.

Thus, it is preferable and simpler to control the escape times of the carriers of the collection quantum wells by a temperature-independent process, namely the tunnel effect, instead of controlling them by a process highly dependent on the temperature, namely thermoionic emission.

It is added that in the case of FIGS. 2 and 3, a homogeneous charge carrier introduction into the active zone has been assumed. Thus, the side, with respect to the active well, where there is an accumulation of the electrodes is mainly dependent on the direction of the piezoelectric field of the barriers (left side in FIGS. 2 and 3). Thus, in the case of a laser diode, there is no need to specify the side (N) where the electrons are injected or the side (P) where the holes are injected.

The piezoelectric barrier layers and the collection quantum well layers of the heterostructure of FIG. 3 can be formed from slightly different semiconductors.

In the embodiment of FIG. 3, the forbidden band width of the collection quantum wells $CQW_{11}$ and $CQW_{22}$ is chosen greater than that of the collection quantum wells $CQW_{12}$ and $CQW_{21}$ in order to obtain favorable energy conditions for the tunnel effect.

As has been shown hereinbefore, apart from the case where the spectrum of the laser radiation is directly controlled by the current injected into the laser diode, it is possible to consider applications where it is of interest to render this current constant and control the wavelength $\lambda_0$ modulation by an auxiliary laser beam, which can be pulsed or continuous. This is possible for diodes constructed in accordance with the teaching of the second and third embodiments.

The said auxiliary laser beam must fulfil the following conditions:

(a) the energy of the photons of this auxiliary beam must exceed the forbidden band width of the piezoelectric barrier layers and (b) the intensity of said beam must be sufficiently high to optically induce the charges of the heterostructure.

It is pointed out that this auxiliary laser beam is directed onto the active zone responsible for the laser emission and absorbed by said zone.

Examples of heterostructures will now be given.

An important aspect of the present invention is that it can be implemented with any semiconductor heterostructure, as a function (a) of the specific envisaged application, (b) the desired wavelength for the laser radiation and (c) the available production procedure.

It is e.g. possible to use type III–V or II–VI semiconductors having crystalline structures of the zinc blende or wurtzite types. For the second and third embodiments, it is possible to grow heterostructures of the zinc blende type on a semiconductor layer, e.g. a semiconductor substrate, which has high crystallographic indices (n, 1, m) with n×1×m≠0, whereas it is sufficient to grow heterostructures of the wurtzite type, e.g. along the axis c of the crystal lattice of the heterostructure (i.e. the axis having the greatest crystalline symmetry).

A number of examples are given hereinafter:

- (a) heterostructures InGaAsP/InAlAsP on InP substrates, for laser diodes emitting at telecommunications wavelengths (1, 3 and 1.55 $\mu$m) and compatible with InP technology,
- (b) heterostructures InGaAs/GaAlAs on GaAs substrates, for laser diodes emitted in the range 0.8 to 1 $\mu$m,
- (c) heterostructures ZnCdSe/ZnSe on GaAs substrates, for lasers emitting at 0.5 $\mu$m and
- (d) heterostructures of the InGaN/AlGaN wurtzite type on sapphire substrates, for diodes emitting in the range 0.3 to 0.4 $\mu$m.

An example will now be given of a III–V heterostructure emitting at 1.55 $\mu$m. Said heterostructure is coherently grown on an InP(lll) substrate. It is an example corresponding to the second preferred embodiment. The stress state of each of the layers is defined with respect to the crystalline parameters of the substrate. The constitution of the zone corresponding to the confinement layers and the active layer is as follows:

confinement layer $C_2$ adapted to the lattice, of $In_{0.52}Al_{0.48}As$ of thickness 300 nm, layer $CQW_1$ of compressed collection quantum well, of In0.63Ga0.37As of thickness 5 nm, layer $PB_1$ of expanded piezoelectric barrier, of $In_{0.42}Al_{0.58}As$ of thickness 20 nm, layer AQW of compressed active quantum well, of $In_{0.63}Ga_{0.37}As$ of thickness 15 nm, layer $PB_2$ of expanded piezoelectric barrier, of $In_{0.42}Al_{0.58}As$ of thickness 20 nm, layer $CQW_2$ of compressed collection quantum well, of $In_{0.63}Ga_{0.37}As$ of thickness 5 nm, confinement layer $C_3$ adapted to the lattice, of $In_{0.52}Al_{0.48}As$ of thickness 300 nm.

An example will now be given of a II–VI heterostructure corresponding to the third preferred embodiment of the invention: (211) $Cd_{0.96}Zn_{0.4}Te$ substrate 2 $\mu$m of $Cd_{0.78}Mg_{0.22}Te$ buffer layer 200 nm of $Cd_{0.50}Mg_{0.50}Te$ first lower confinement layer 300 nm of $Cd_{0.70}Mg_{0.30}Te$ second lower confinement layer $C_2$ 7 nm of $Cd_{0.85}Mg_{0.15}Te$ $CQW_{11}$ 5 nm of $Cd_{0.62}Zn_{0.08}Mg_{0.30}Te$ $PB_{11}$ 7 nm of $Cd_{0.92}Mg_{0.08}Te$ $CQW_{12}$ 5 nm of $Cd_{0.62}Zn_{0.08}Mg_{0.30}Te$ $PB_{12}$ 15 nm of CdTe AQW 5 nm of $Cd_{0.62}Zn_{0.08}Mg_{0.30}Te$ $PB_{21}$ 7 nm of $Cd_{0.92}Mg_{0.08}Te$ $CQW_{21}$ 5 nm of $Cd_{0.62}Zn_{0.08}Mg_{0.30}Te$ $PB_{22}$ 7 nm of $Cd_{0.85}Mg_{0.15}Te$ $CQW_{22}$ 300 nm of $Cd_{0.70}Mg_{0.30}Te$ first upper confinement layer $C_3$ 200 nm of $Cd_{0.50}Mg_{0.50}Te$ second upper confinement layer 5 nm CdTe covering layer In the two examples given hereinbefore, the respective dopings of the layers and the substrate are chosen so as to form a P-I-N junction.

A first sample of the aforementioned II–VI heterostructure was formed in order to demonstrate the modulation principle of the laser emission wavelength. In order to avoid an "awkward" manipulation of the sample, it was decided to adopt optical and not electrical pumping. The sample was cleaved in order to form a bar-shaped cavity, defined by two parallel faces.

An optical pumping experiment was carried out in order to obtain the emission of a laser radiation and the charging of the heterostructure using a pulsed Nd:YAG 532 nm laser. Working at a temperature of 80 K, edge emission spectra were plotted for said bar on either side of the laser threshold.

By increasing the optical pumping power above said threshold from 6 to 30 kW/cm$^2$, there was found to be a shift of approximately 3 to 4 nm towards high wavelengths for the wavelength of the laser radiation in the spectral range centered on 800 nm.

The invention makes it possible to implement apparatuses other than laser diodes. It is possible to produce light amplifiers, which consequently have no laser cavity.

It is also possible to produce, according to the invention, an "all optical" laser. The P-I-N junction is then unnecessary. It is then sufficient to use the heterostructure with its active zone. The wavelength modulation and gain are then obtained by means of one or a plurality of laser beams.

What is claimed is:

1. Tunable laser comprising a semiconductor heterostructure, said laser being characterized in that the heterostructure comprises an active zone having at least one quantum well called an active quantum well and which emits a laser radiation during the introduction of charge carriers into the active zone and at least one other quantum well called the collection quantum well, on either side of the active quantum well, the collection quantum wells being provided for collecting and confining part of the charge carriers introduced, and means for distributing charge carriers in the collection quantum wells so as to create a space charge field for acting on the active quantum well during the emission of the laser radiation by modifying, by an electrooptical effect, the gain spectrum of said active quantum well.

2. Laser according to claim 1, wherein the lowest optical transition of each of the collection quantum wells is at an energy higher than that of the active quantum well.

3. Laser according to claim 1, wherein the fundamental states of the valence and conducting bands of the heterostructure are in the active quantum well.

4. Laser according to claim 1, said laser forming a laser diode, the heterostructure forming a P-I-N junction for forward biasing and having an intrinsic zone between a type P zone and a type N zone, the active zone being formed in said intrinsic zone, the laser radiation being emitted during the injection of a charge carrier current into the active zone.

5. Laser according to claim 4, wherein the charge carrier distribution means comprise means for the forward biasing of the P-I-N junction, the inhomogeneity of the injection current in the active zone being responsible for the separation of the charge carriers.

6. Laser according to claim 1, wherein the charge carrier distribution means comprise two piezoelectric barriers, which are respectively placed on either side of the active quantum wells and which, by means of their piezoelectric fields, give rise to an accumulation of electrons and holes on either side of the active quantum well.

7. Laser according to claim 6, wherein the active quantum well has no piezoelectric field or a piezoelectric field with a direction opposite to that created by the piezoelectric barriers.

8. Laser according to claim 6, wherein the active quantum well has a piezoelectric field of the same direction as that created by the piezoelectric barriers.

9. Laser according to claim 6, wherein the collection quantum wells are designed so that the times taken by the charge carriers for escaping said collection quantum wells are approximately 1 nanosecond.

10. Laser according to claim 1, wherein the active zone comprises at least two piezoelectric barriers and at least two collection quantum wells on either side of the active quantum well, the charge carrier distribution means comprising said piezoelectric barriers.

11. Laser according to claim 10, wherein the forbidden band width of each of the collection quantum carriers, which are furthest from the active quantum well, exceeds that of each of the other collection quantum wells.

12. Laser according to claim 4, wherein the number of charge carriers introduced is constant and the wavelength of the laser radiation is controlled by an auxiliary laser beam, whose photons have an energy greater than the forbidden band width of each piezoelectric barrier and whose intensity is sufficiently high to optically induce a charging of the heterostructure.

13. Laser according to claim 12, wherein the charge carriers are introduced by means of a laser beam for pumping the active zone.

14. Laser according to claim 13, wherein the laser beam provided for pumping the active zone also constitutes the auxiliary laser beam.

15. Laser according to claim 1, wherein the heterostructure is made from III–V or II–VI crystalline semiconductor materials, whose crystalline structures are of the zinc blende or wurtzite type.

16. Laser according to claim 1, wherein the heterostructure is formed from III–V or II–VI crystalline semiconductor materials, whose crystalline structures are of the zinc blende type and said heterostructure is formed on a semiconductor layer, which has high crystallographic indices (n, 1, m), n×1×m differing from 0.

17. Laser according to claim 1, wherein the heterostructure is formed from III–V or II–VI crystalline semiconductor materials, whose crystalline structures are of the wurtzite type and said heterostructure is formed along axis c of the crystal lattice of the heterostructure.

18. Laser according to claim 1, wherein the electrooptical effect is the quantum confined Stark effect.

19. Laser according to claim 6, wherein the number of charge carriers introduced is constant and the wavelength of the laser radiation is controlled by an auxiliary laser beam, whose photons have an energy higher than the forbidden band width of each piezoelectric barrier and whose intensity is sufficiently high to optically induce a charging of the heterostructure.

20. Laser according to claim 10, wherein the number of charge carriers introduced is constant and the wavelength of the laser radiation is controlled by an auxiliary laser beam, whose photons have an energy higher than the forbidden band width of each piezoelectric barrier and whose intensity is sufficiently high to optically induce a charging of the heterostructure.

* * * * *